US006910847B1

(12) United States Patent
Blaufus et al.

(10) Patent No.: US 6,910,847 B1
(45) Date of Patent: Jun. 28, 2005

(54) PRECISION POLAR COORDINATE STAGE

(75) Inventors: Christopher W. Blaufus, San Jose, CA (US); Blaine R. Spady, Lincoln, NE (US); John D. Heaton, Fremont, CA (US); Dan M. Colban, Tracy, CA (US)

(73) Assignee: Nanometrics Incorporated, Milpitas, CA (US)

( * ) Notice: Subject to any disclaimer, the term of this patent is extended or adjusted under 35 U.S.C. 154(b) by 158 days.

(21) Appl. No.: 10/199,140

(22) Filed: Jul. 19, 2002

(51) Int. Cl.[7] ............................................. B66C 23/00
(52) U.S. Cl. ............................... 414/744.5; 414/749.1; 414/749.6; 414/751.1; 414/752.1
(58) Field of Search ..................... 414/744.5, 749.1, 414/749.6, 751.1, 752.1, 744.1

(56) References Cited

U.S. PATENT DOCUMENTS

| | | | | |
|---|---|---|---|---|
| 4,449,884 A | * | 5/1984 | Motoda ..................... | 414/751.1 |
| 4,897,015 A | | 1/1990 | Abbe et al. ............... | 414/744.8 |
| 5,456,561 A | * | 10/1995 | Poduje et al. ............. | 414/744.5 |
| 5,743,705 A | * | 4/1998 | Eissfeller .................. | 414/749.1 |
| 6,068,442 A | * | 5/2000 | Flemmer et al. .......... | 414/744.5 |
| 6,752,580 B2 | * | 6/2004 | Soraoka et al. ........... | 414/217.1 |

* cited by examiner

Primary Examiner—Eileen D. Lillis
Assistant Examiner—Michael Lowe
(74) Attorney, Agent, or Firm—Silicon Valley Patent Group LLP

(57) ABSTRACT

A polar coordinate stage that may be used in a chamber includes a rotating chuck that moves in a linear direction and has the motors that drive the motion of the chuck outside the chamber. The stage can include a linkage of arms to support and drive the linear motion of the chuck. The chuck is coupled to a horizontal rail such that rotational motion of a first arm is translated into precise linear motion of the chuck along the horizontal rail through a second arm. In addition, a system of pulleys within the arms translates rotational (or linear) motion through the arms and rotates the chuck. Vertical motion may be provided by an actuator between the second arm and the chuck or by a motor under the stage. Because of the compact nature of the stage, it can be easily placed within a chamber.

43 Claims, 13 Drawing Sheets

PRECISION POLAR COORDINATE STAGE

FIELD OF THE INVENTION

The present invention relates to a stage for handling a substrate, and in particular a precision polar coordinate, i.e., an R-θ, stage that is vacuum compatible.

BACKGROUND

Substrates, such as semiconductor wafers or flat panel displays, are typically processed in multiple steps. Many of these steps require the measurement and inspection of surface characteristics. Surface measurement and inspection typically are performed using a stage that moves the substrate so that the entire surface of the substrate can be measured or inspected. For accurate measurements, a stage must be capable of moving a substrate with high accuracy, i.e. capable of positioning with an accuracy of ±1 to 5 μm.

One type of stage used in measuring and inspecting substrates is an X-Y stage, which can move a substrate in two independent orthogonal directions, X and Y, to select an area on a substrate for viewing, imaging, or measurement. However, the footprint of an X-Y stage must be at least twice the diameter of the substrate to be measured in both the X and Y direction. Consequently, an X-Y stage requires a large area, particularly if 300 mm substrates are being inspected.

Another type of stage used in the measuring of substrates is a polar coordinate stage, otherwise known as an R-θ stage. R-θ stages move a substrate in a single linear direction (R-motion) and also rotate the stage (θ-motion). By moving the substrate in the R direction and rotating the substrate, any area on the substrate surface may be appropriately positioned for viewing, imaging, or measuring.

As described above, substrate measurement and inspection requires linear motion of a stage in at least one direction. One method to create linear motion is to translate rotary motion into linear motion. The prior art discloses a device that converts rotary motion into linear motion using a system of belts and pulleys, as is described in U.S. Pat. No. 4,897,015. However, this is a complicated design that is not easily adapted for use in the highly precise measurements of substrates on a stage.

Some substrates, e.g., semiconductor wafers, are very sensitive to environmental conditions. Accordingly, during processing, it is often desirable to inspect a substrate without altering the environmental conditions, e.g., the substrate could be measured within the processing chamber.

Thus, what is needed is a precision stage with a compact design that can accommodate substrates, including small or large substrates, and that is compatible for use in a chamber environment so as to eliminate contamination problems.

SUMMARY

A polar coordinate stage in accordance with an embodiment of the present invention is compact and may be vacuum compatible so that it may operate within a processing chamber and is vacuum compatible. In one embodiment, the stage includes a first arm that rotates about a first end and that is rotatably coupled to a second arm at the other end. The second arm is coupled to the chuck and a horizontal rail. The stage translates rotational motion of the first arm into linear motion of the chuck along the horizontal rail. In addition, the stage may include a pulley system within the first and second arms to translate a rotational motion of a pulley at the first end of the first arm into rotational motion of the chuck.

In one embodiment, an apparatus includes a stage for handling a substrate, the stage having a first arm having a first end and a second end. A second arm is rotatably coupled to the second end of the first arm. The chuck is rotatably coupled to the other end of the second arm. A horizontal rail is slidably coupled to the chuck, wherein the chuck moves along the horizontal rail. A first motor is coupled to the chuck and drives the horizontal linear motion of the chuck. In addition, there is a second motor that is coupled to the chuck and that drives the rotation of the chuck. An actuator may be coupled between the second arm and the chuck to provide the vertical motion of the chuck. The first motor may be coupled to the end of the first arm to rotate the first arm which is translated into linear motion of the chuck. Alternatively, the first motor may be coupled to the chuck through, e.g., a leadscrew. The second motor may be coupled to the chuck by a belt and pulley system through the first and second arms, which translates motion from the second motor into rotation of the chuck. Alternatively, the second motor may be coupled to the chuck through, e.g., a leadscrew and a coupling that translates rotation of the leadscrew into rotation of the chuck. A third motor may be located under the stage to move the first and second arms, the horizontal rail, and the chuck vertically. The apparatus may include a chamber, where the first arm, second arm, the horizontal rail, and the chuck are within the chamber, and the first motor, the second motor are outside the chamber.

In another embodiment of the present invention, a method of moving a chuck includes rotating a first arm about a first end and translating that rotation through a second arm into horizontal linear motion of the chuck along a horizontal rail. The method further includes rotating a pulley in the first arm and translating that rotation through the first arm and said second arm and into rotation of said chuck. The method further includes moving the chuck vertically using an actuator coupled between the second arm and the chuck. In another embodiment, the method includes moving the first arm, the second arm, the horizontal rail and the chuck vertically using a motor positioned under the first arm, the second arm, the horizontal rail and the chuck.

In another embodiment, a method of moving a chuck includes driving a leadscrew and translating the rotation of the leadscrew into horizontal linear motion of the chuck along a horizontal rail. The method includes rotating a pulley in a first arm that is rotatably coupled to a second arm, where the chuck is coupled to the second arm. The rotation of the pulley is translated the first arm and the second arm and into rotation of said chuck.

In yet another embodiment, an apparatus includes a rotatable arm that is rotatable about a first end and a second arm having a first end coupled to a second end of the rotatable arm. A chuck is coupled to a second end of the second arm and a horizontal rail is coupled to the chuck. A first motor is coupled to the chuck to drive the linear motion of the chuck and a second motor is coupled to the chuck to drive the rotational motion of the chuck. The apparatus includes a chamber where the rotatable arm, the second arm, the chuck, and the horizontal rail are located inside of the chamber and the first motor and the second motor are located outside the chamber. The first motor may be coupled to the first end of the first arm, such that when the rotatable arm rotates about the first end, the rotation is translated through the second arm to move the chuck linearly along the horizontal rail. The apparatus may further include a first rotatable pulley in the first end of the rotatable arm, a second rotatable pulley in the second end of the rotatable arm and the first end of the second arm, the second rotatable pulley is coupled to the first rotatable pulley, and a third rotatable pulley in the second end of the second arm. The third rotatable pulley is coupled to the second rotatable pulley and the chuck, wherein the rotation of the first rotatable pulley is translated through the second rotatable pulley and the third rotatable pulley to rotate the chuck. The first and second motors may be coupled to the chuck through leadscrews. An actuator may be coupled between the second arm and the chuck to provide vertical motion to the chuck, or a third motor may be located under the rotatable arm, the second arm, the chuck, and the horizontal rail to provide vertical motion to all these elements.

Another embodiment of the present invention includes a chamber and a polar coordinate stage within the chamber. A first motor drives the horizontal linear motion of the chuck of the polar coordinate stage within the chamber, where the first motor is mounted outside the chamber. Likewise, a second motor drives rotational motion of the chuck of the polar coordinate stage within the chamber, where the second motor is mounted outside the chamber. A prealigner may be mounted in the chamber. A substrate lift may also be included in the chamber.

In another embodiment, a method of moving a chuck within a chamber includes, actuating a first motor mounted outside the chamber and translating the motion of the first motor into horizontal linear motion of the chuck within the chamber. The method includes actuating a second motor mounted outside the chamber and translating motion of the second motor into rotational motion of the chuck.

An embodiment of loading and unloading a substrate from a chuck within a chamber includes moving the chuck away from the door of the chamber and loading a substrate onto a substrate lift within the chamber through the door. The substrate lift and substrate are raised, and the chuck moves under the substrate. The substrate lift is then lowered to place the substrate on the chuck. To unload the substrate, the substrate lift is raised to remove the substrate from the chuck, the chuck is moved away from the door. The substrate lift is then lowered and the substrate is unloaded from the substrate lift through the door. The loading process may include, e.g., prealigning the substrate on the chuck.

FIGS, 7, 8, 9, and 10 show perspective, top, front, and side views of another stage in accordance with an embodiment of the present invention.

Figure 7:
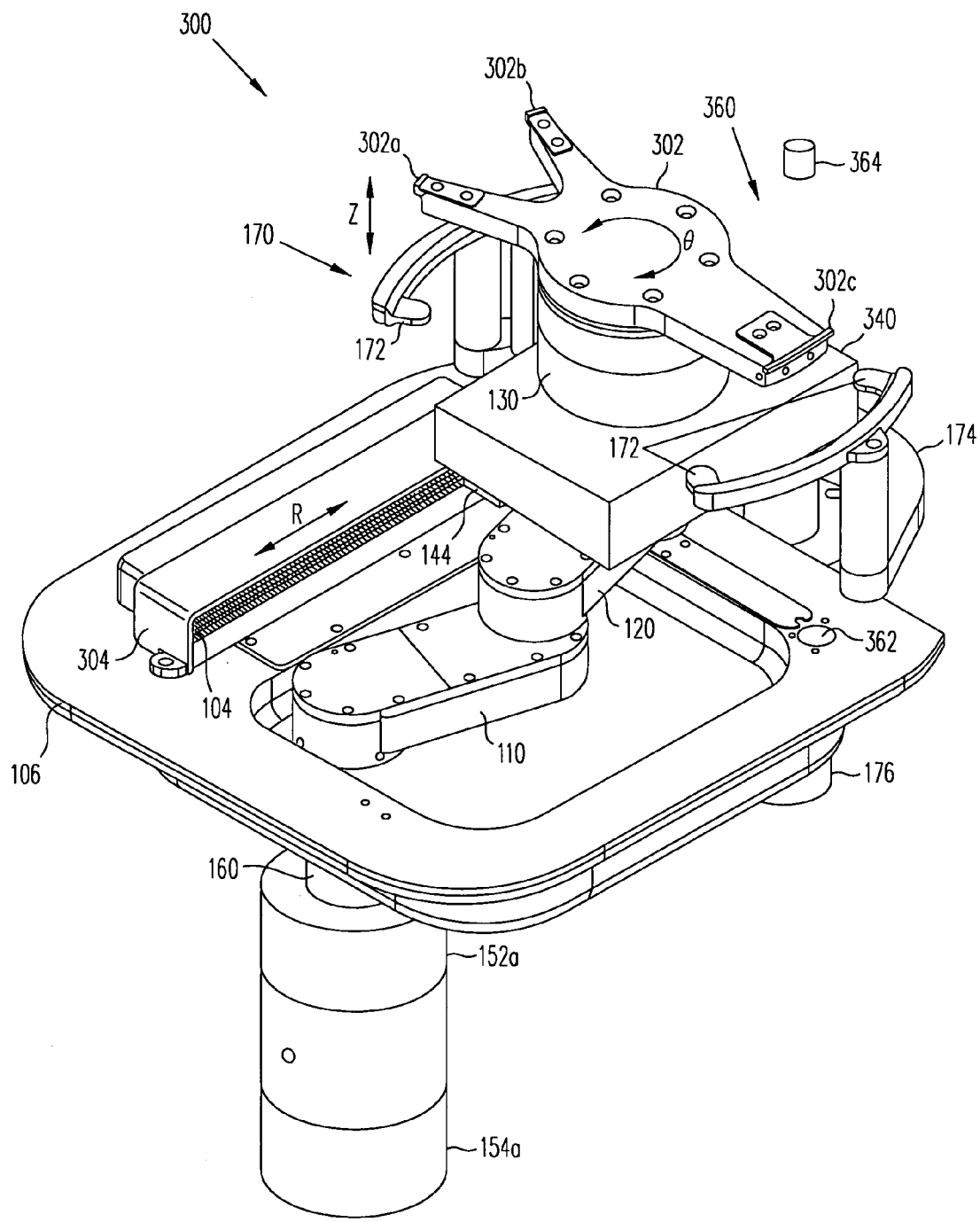
Figure 8:
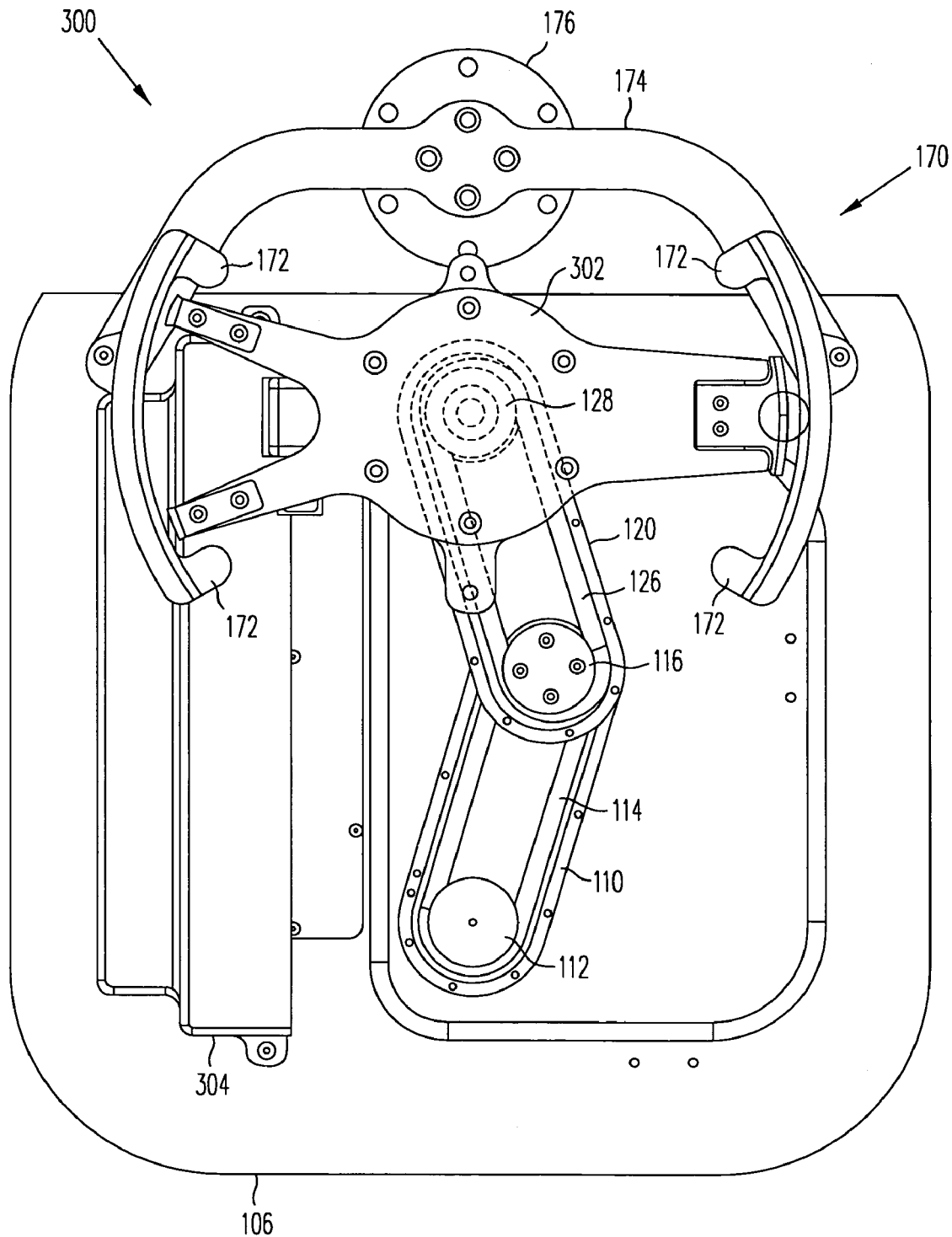
Figure 11:
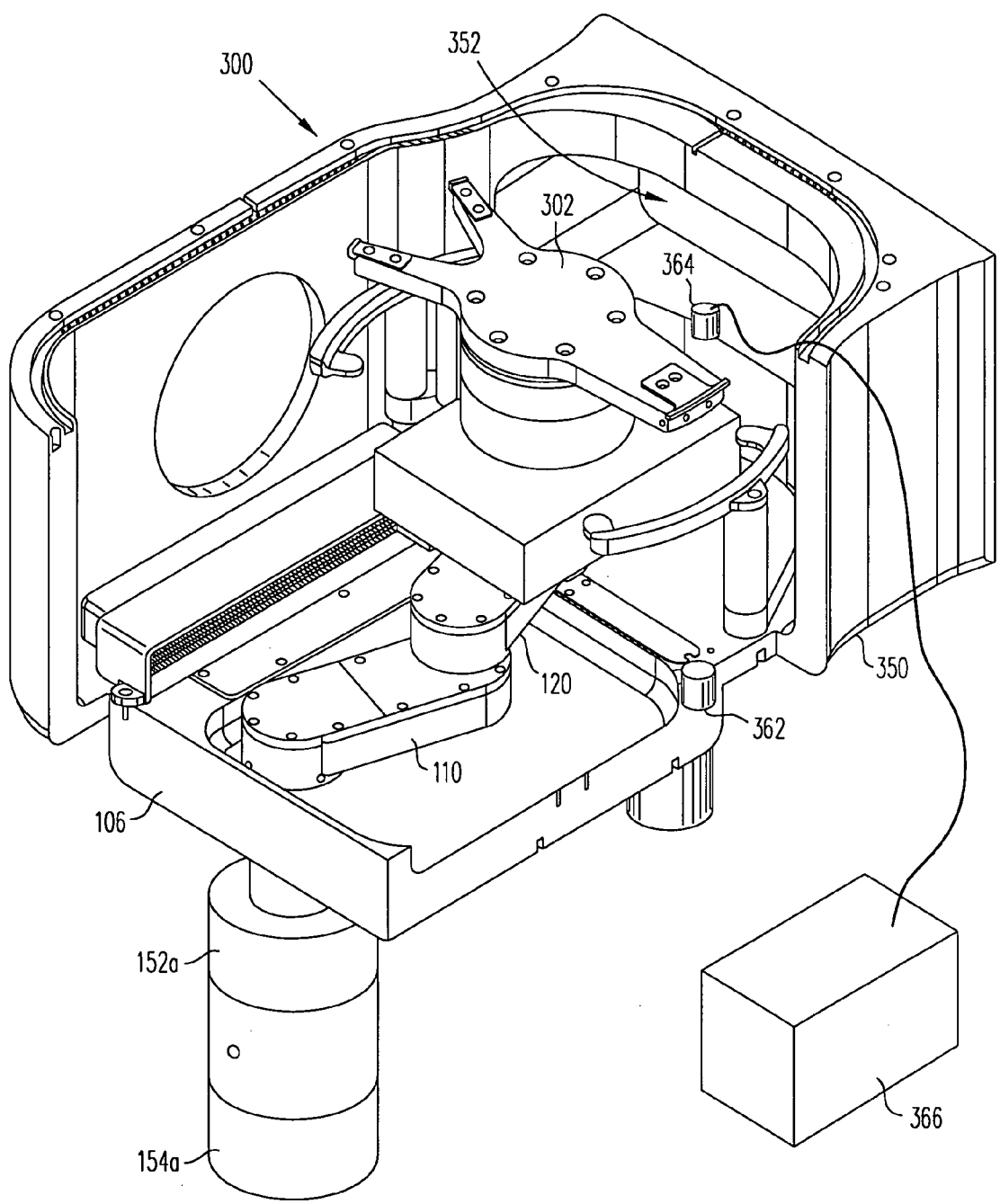

FIG. 11 shows a perspective view of the stage of FIG. 7 in a chamber.

Figure 12:
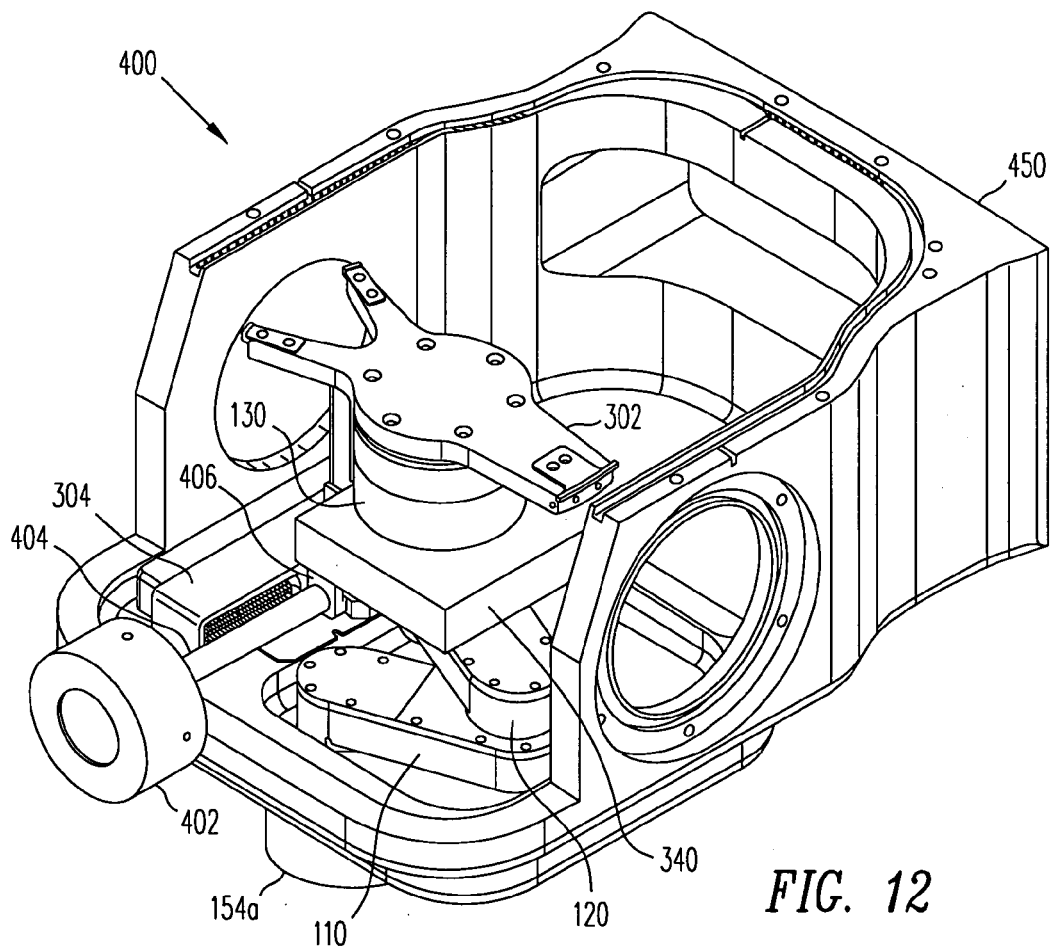
Figure 13:
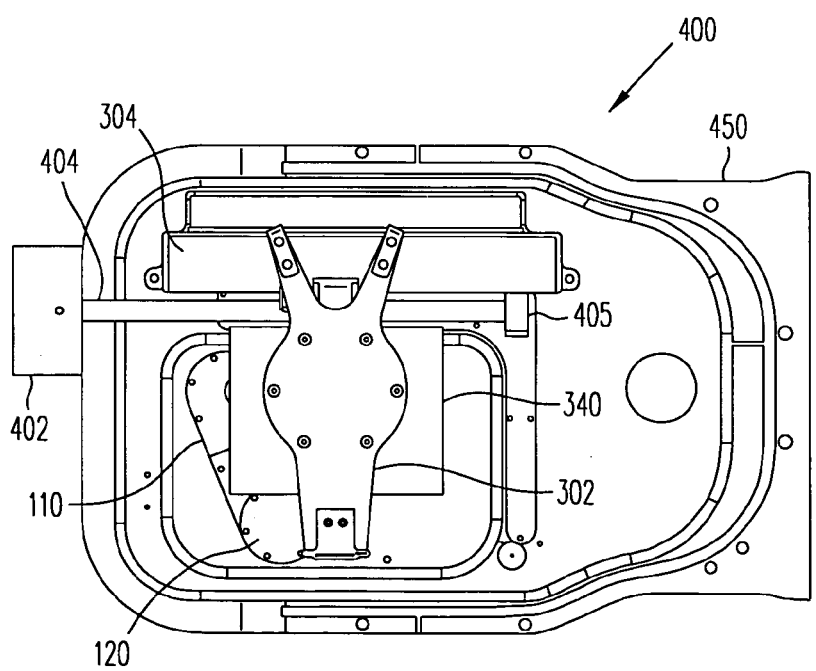

FIGS. 12 and 13 show perspective and top views of another stage in accordance with an embodiment of the present invention.

Figure 14:
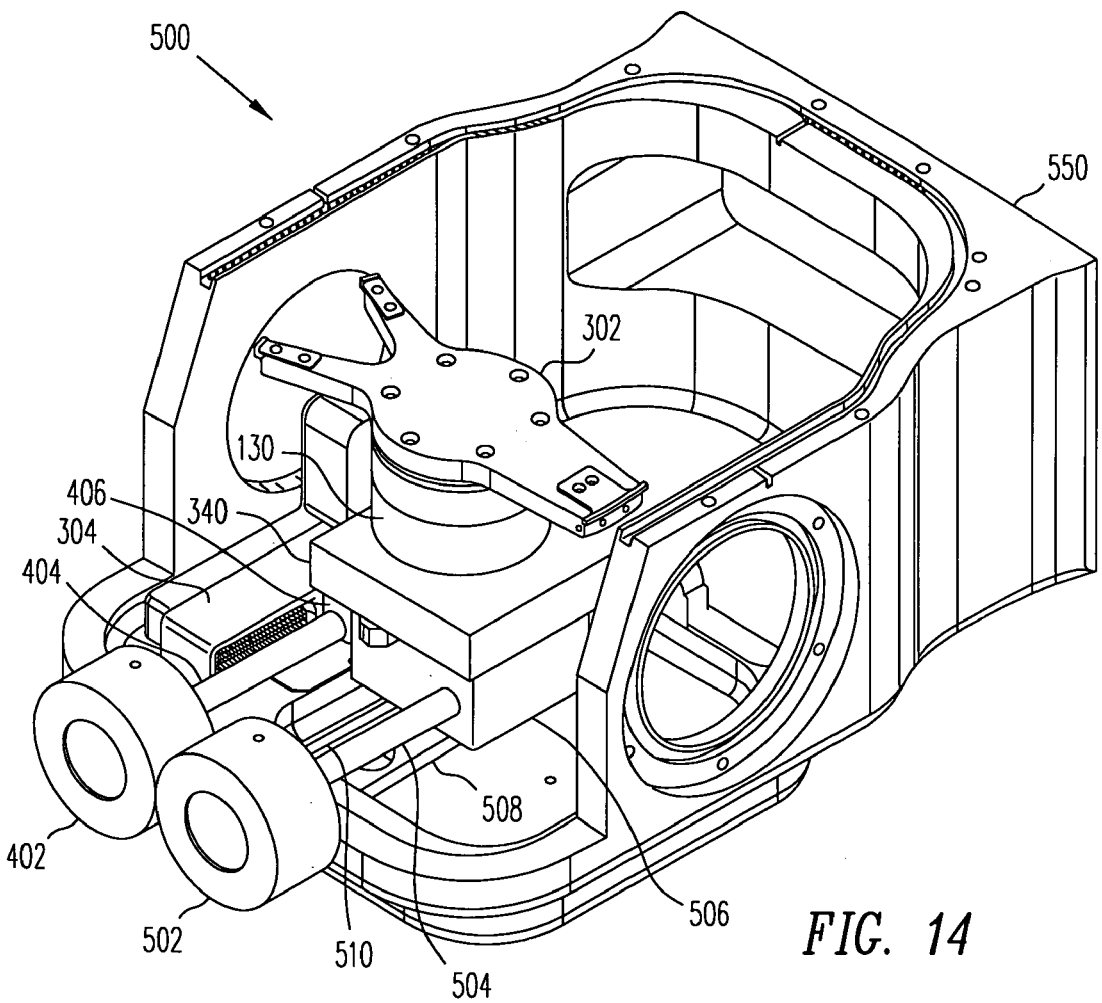
Figure 15:
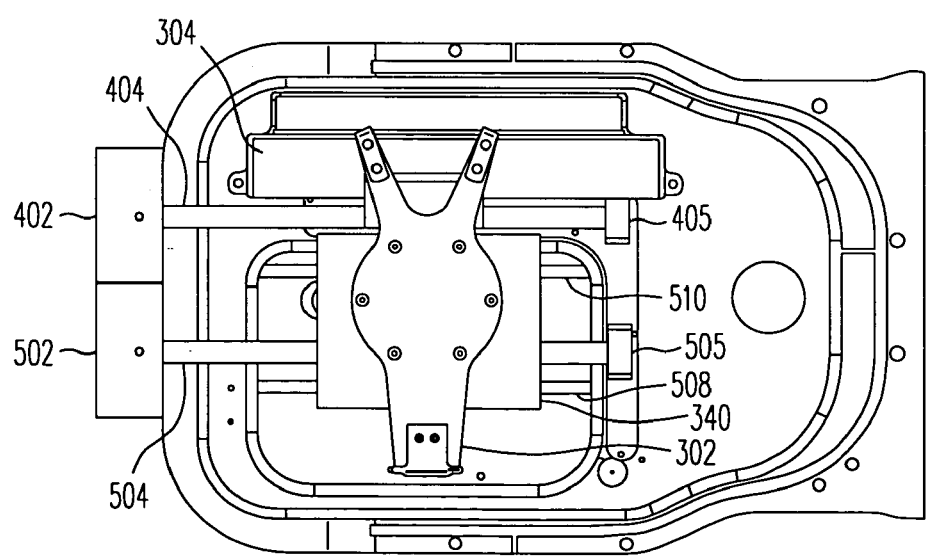

FIGS. 14 and 15 show perspective and top views of another stage in accordance with an embodiment of the present invention.

DETAILED DESCRIPTION

In accordance with the present invention, a compact, high precision polar coordinate stage provides horizontal linear motion (R-motion) and rotational motion (θ-motion). The stage assembly has a compact design and is vacuum compatible, which permits the use of the stage in a chamber. Accordingly, there is no need to expose a substrate to an ambient environment when measuring or inspecting the substrate. The stage may be used in the semiconductor processing industry in the measurement or inspection of substrate surface characteristics substrates, such as 200 mm and 300 mm wafers, as well as other sizes. Alternatively, it may be used in any industry or process that requires a stage for use in precision surface measurements, a vacuum compatible stage, or a stage with a compact design. Additionally, the current stage may be used with an image rotation system such as that described in U.S. Pat. No. 6,320,609 by Robert Buchanan et al., issued Nov. 20, 2001, which is incorporated herein by reference.

Figure 1:
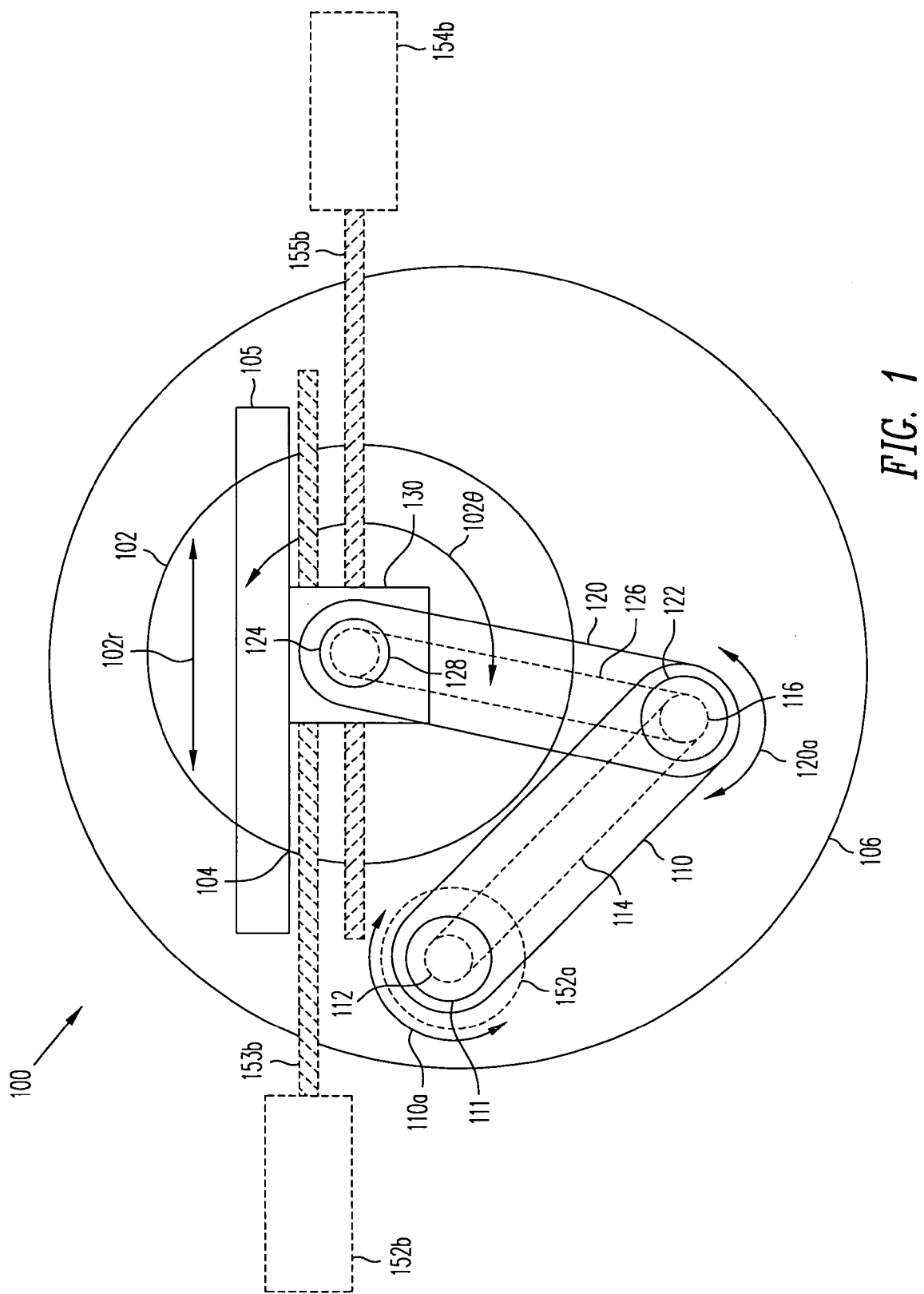
FIGS. 1 and 2 show perspective and side views of a stage in accordance with one embodiment of the present invention.
Figure 2:
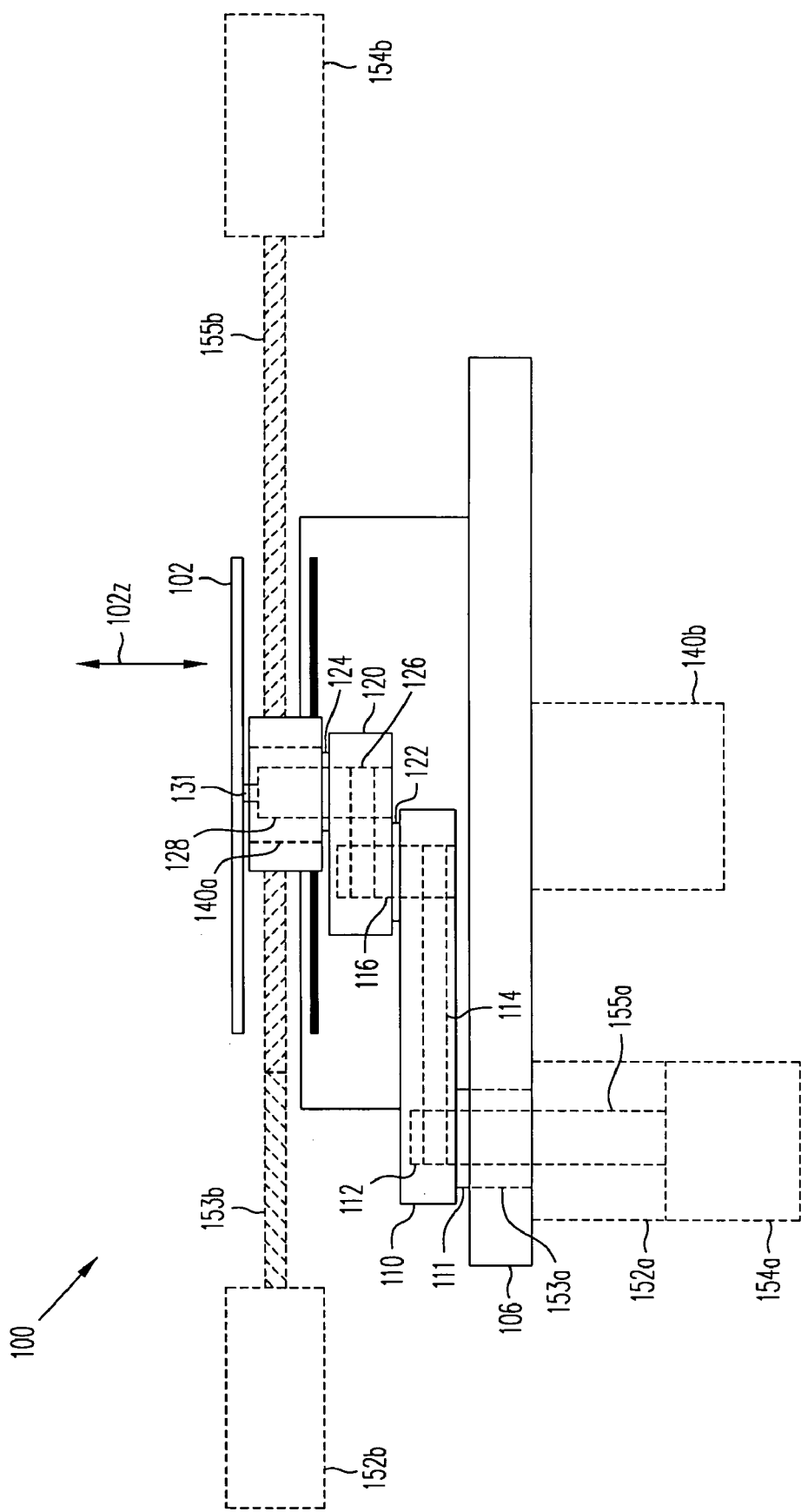

FIGS. 1 and 2 shows a top and side view of one embodiment of a high precision compact polar coordinate stage 100, in accordance with the present invention. Certain items in FIGS. 1 and 2 are shown as transparent for clarity.

Stage 100 includes a chuck 102 that moves linearly (illustrated by arrow 102r) and rotational motion (illustrated by arrow 102θ). The chuck 102 serves as a platform that holds a substrate (not shown) gravitationally, electromagnetically or by any other appropriate manner. Chuck 102 is coupled to a first arm 110 and a second arm 120 and is slidably coupled to a horizontal rail 104, which guides the linear motion of chuck 102. The horizontal rail 104 is mounted on a stationary support 105. Stationary support 105, for example, may be mounted to the base plate 106 or may be part of the base plate 106.

First arm 110 is rotatably coupled at one end to the base plate 106, e.g., by a bearing 111, and the second arm 120 is rotatably coupled to the other end of the first arm 110 by another bearing 122. The opposite end of the second arm 120 is coupled to the chuck 102, e.g., through a theta housing 130, that permits the chuck 102 to rotate independently of the movement of the arms 110 and 120. The theta housing 130 is rotatably mounted on the second arm 120, e.g., by bearing 124, and the theta housing 130 is slidably engaged with rail 104. Thus, when chuck 102 moves linearly along rail 104, the theta housing 130 rotates relative to the second arm 120 at bearing 124, second arm 120 rotates relative to the first arm 110 at bearing 122 (illustrated by arrow 122a), and the first arm 110 rotates relative to the base plate 106 at bearing 111 (illustrated by arrow 110a). Advantageously, the linear motion of chuck 102 is guided by rail 104 while chuck 102 is being supported by arms 110 and 120.

Stage 100 includes a motor coupled to chuck 102 to produce the desired linear motion. As illustrated in FIGS. 1 and 2, a motor 152a (illustrated with broken lines) may be located below the base plate 106 and is coupled to the first arm 110 by a shaft 153a. The motor 152a drives the rotation of arm 110 by shaft 153a. The shaft 153a may replace bearing 111 or may be coupled to arm 110 and cause the rotation of arm 110 around bearing 111. When motor 152 rotates the first arm 110, the second arm 120 is caused to rotate and the chuck 102 moves linearly along the horizontal rail 104.

Alternatively, the linear motion of chuck 102 in stage 100 may be caused by a motor 152b (illustrated by broken lines), that is located to the side of the theta housing 130. The motor 152b, e.g., may rotate a leadscrew 153b that is engaged by a lead nut coupled to the theta housing 130 or other element. The rotation of the leadscrew 153b thus causes the linear motion of the chuck 102. With this embodiment, there is no need for motor 152a under the base. Nevertheless, arms 110 and 120 provide support for chuck 102.

Chuck 102 also includes rotational motion (illustrated by arrow 1020), which is driven by a second motor. As shown in FIGS. 1 and 2, a motor 154a (illustrated by broken lines) may be located under the base plate 106, similar to motor 152a. Motor 154a is coupled to chuck 102 through, e.g., a belt and pulley system, or other appropriate system to convert motion from motor 154a to rotational motion of chuck 102. As shown in FIGS. 1 and 2, the first arm 110 includes a first pulley 112 and a first belt 114. A second pulley 116 extends from the first arm 110 into the second arm 120. A belt 126 in the second arm 120 connects the second pulley 116 to a third pulley 128. The third pulley 128 is connected to shaft 131, which is also coupled to chuck 102. The belt and pulley system is used to translate motion from a second motor 154a to chuck 102, causing the chuck 102 to rotate.

The belt and pulley system may be sealed within arms 110 and 120. In other embodiments, the belt and pulley system may be exposed. If the system is intended to operate in a vacuum, all belts and pulleys should be vacuum compatible.

It should be understood that because the chuck 102 rotates, the chuck 102 requires only a small amount of linear motion to measure or inspect any point on the substrate. In other words, the chuck 102 need only travel in the R direction by an amount approximately equal to the radius of the largest substrate to be measured.

It should also be understood that the belt and pulley system shown in FIGS. 1 and 2 is an exemplary embodiment. If desired, other systems may be used to translate the motion from motor 154a to the chuck 102. For example, pulleys 112, 116, and 128 may be gears with teeth, so that they accommodate cogged belts 114 and 126. Alternatively, pulleys 112, 116, and 128 may be smooth to accommodate cables instead of belts. Moreover, if desired, shafts may be used instead of belts or cables.

Figure 3:
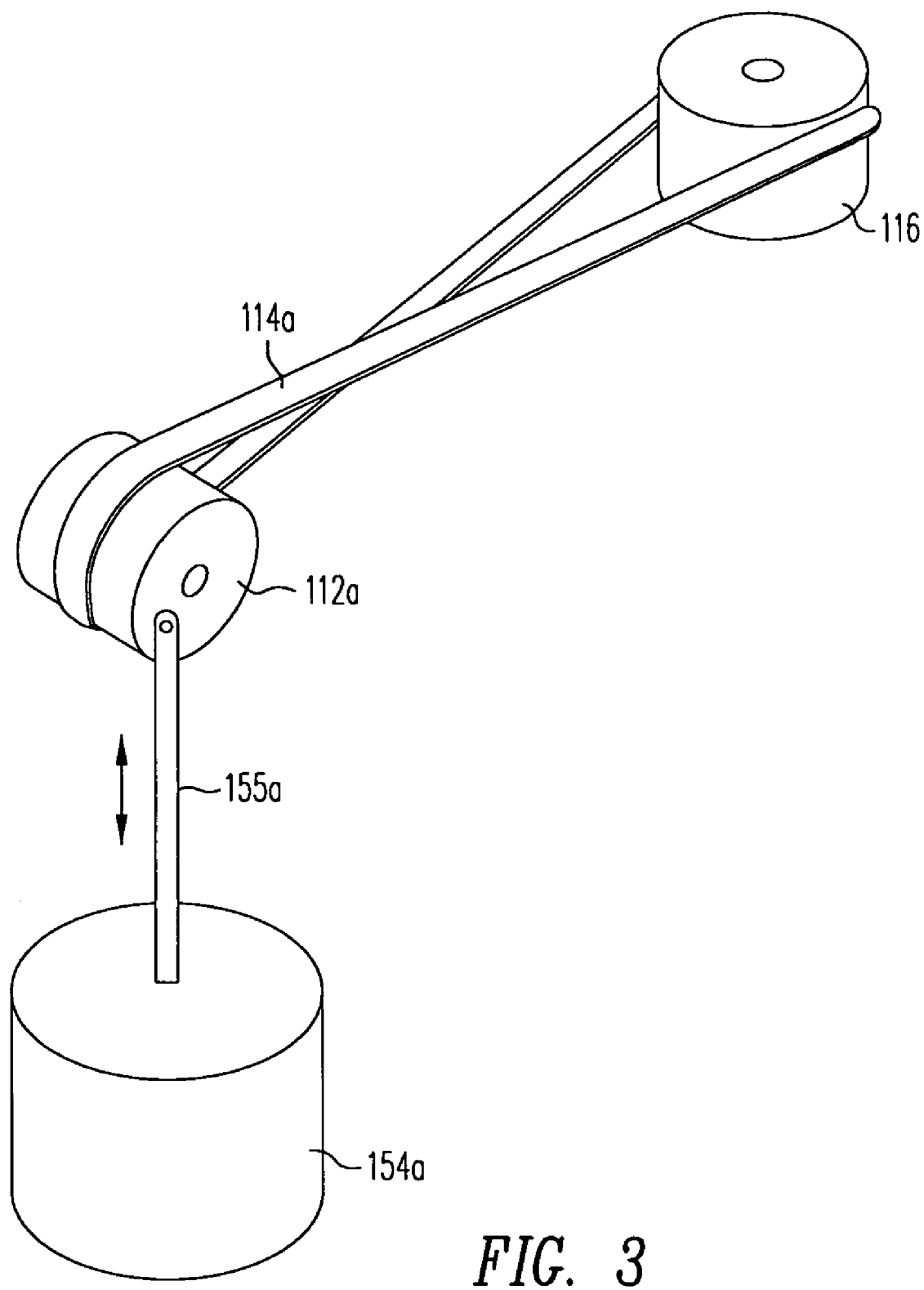
FIG. 3 shows a perspective view of a pulley system to translate vertical linear motion into rotational motion in the stage in accordance with an embodiment of the present invention.

In another embodiment, the second motor 154a may produce a linear motion that is converted into the rotational motion of the chuck 102. FIG. 3 shows, for example, one method of converting linear motion to rotational motion. As shown in FIG. 3, shaft 155a is coupled to motor 154a, which in this embodiment produces linear motion as indicated by the arrow. The shaft 155a is also coupled to a horizontal pulley 112a. The horizontal pulley 112a is coupled to pulley 116, both of which are housed in the first arm 110 (not shown in FIG. 3). Belt 114a couples pulley 112a and pulley 116 together. Accordingly, linear motion produced by motor 154a is translated into rotary motion of pulleys 112a and 116, which is then translated to chuck 102 as described above. It should be understood that because first arm 110 rotates, the shaft 202 needs to be rotatable. This may be accomplished using an appropriate yoke to provide the rotatable connection in shaft 202.

Of course, linear motion may be converted to rotational motion in many different ways, using appropriate cam type devices well known to those skilled in the art.

Alternatively, the rotational motion of chuck 102 may be caused by a motor 154b (illustrated by broken lines), that is located to the side of the theta housing 130. The motor 154b, e.g., rotates a leadscrew 155b that is engaged by theta housing 130 or other element coupled to the theta housing. The rotation of the leadscrew 155b is converted to rotation of the chuck 102, e.g., using a 90 degree gear housing. In addition, a clutch may be used so that the theta housing 130 disengages with leadscrew 155b when chuck 102 is moved linearly. Once linear movement of chuck 102 is stopped, the clutch engages the leadscrew 155b which then can drive the rotational motion of chuck 102. Motor 154b may located on the same side as motor 152b if desired. It should be understood that with the use of motor 154b there is no need for motor 154a under the base.

It should be understood that any combination of motors 152a and 152b may be used with motors 154a and 154b.

In addition, stage 100 may include a Z stage actuator to provide linear vertical motion to chuck 102, as illustrated by arrow 102z in FIG. 2. A Z stage actuator 140a may be located, e.g., between the second arm 120 and the chuck 102. The Z stage actuator 140a may be, e.g., a piezoelectric or other appropriate type actuator. In another embodiment, the Z stage actuator 140b is a motor that is located under the base plate 106. Thus, actuator 140b provides vertical linear motion to chuck 102 along with other components of stage 100, e.g., the arm 110 and 120 and base plate 106.

The configuration of stage 100 advantageously provides a compact yet highly precise design. For example, the stage 100 may easily fit into a chamber. Further because the motors can be located outside the chamber and moving elements of stage 100 can be sealed, e.g., within arms 1;10 and 120, the stage 100 may be used in a vacuum environment. Moreover, stage 100 provides high precision in positioning the chuck. For example, a precision of approximately ±0.5 µm or better may be obtained with the design of stage 100.

Figure 4:
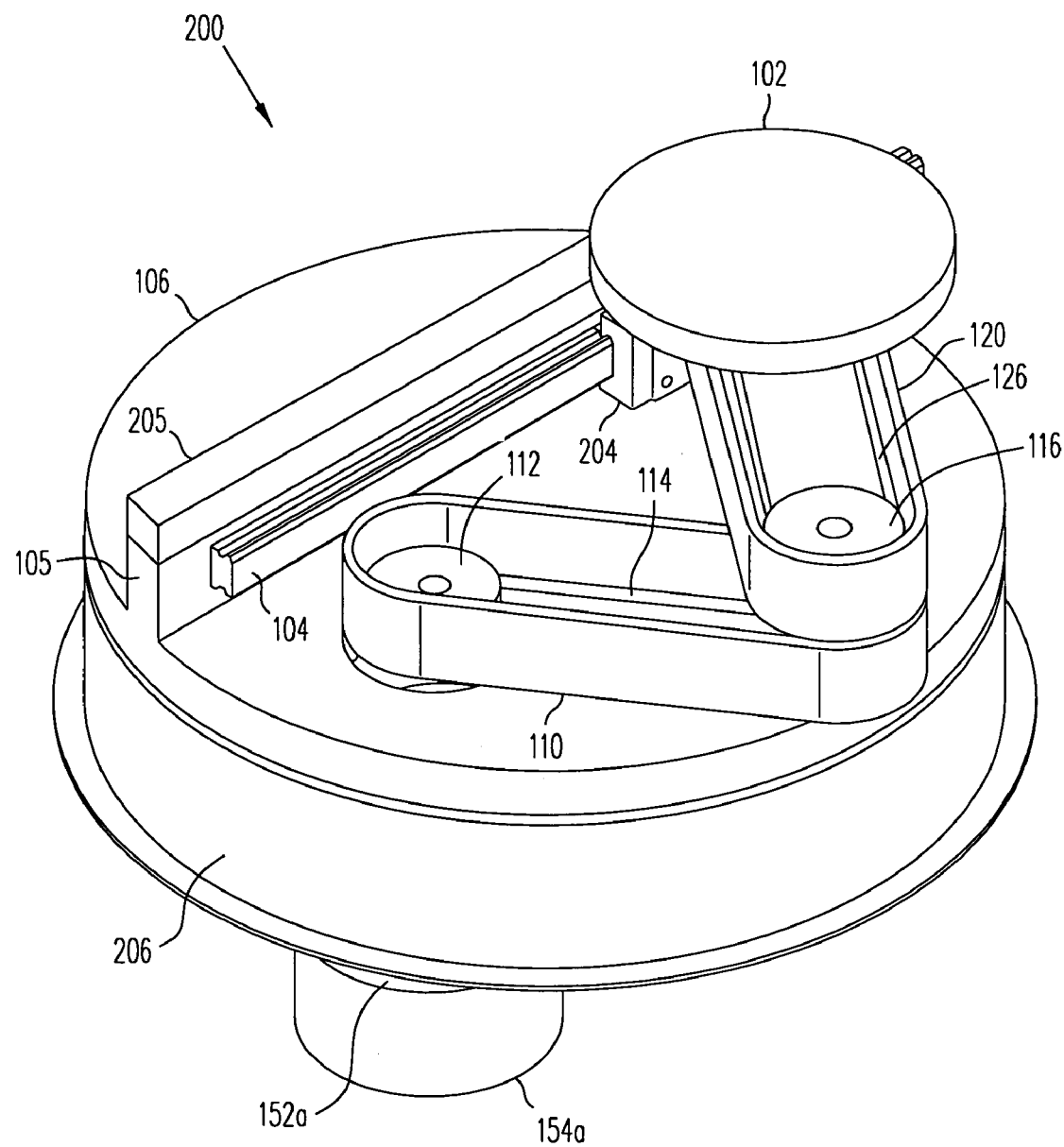
FIGS. 4 and 5 show perspective and side views of another stage in accordance with an embodiment of the present invention.
Figure 5:
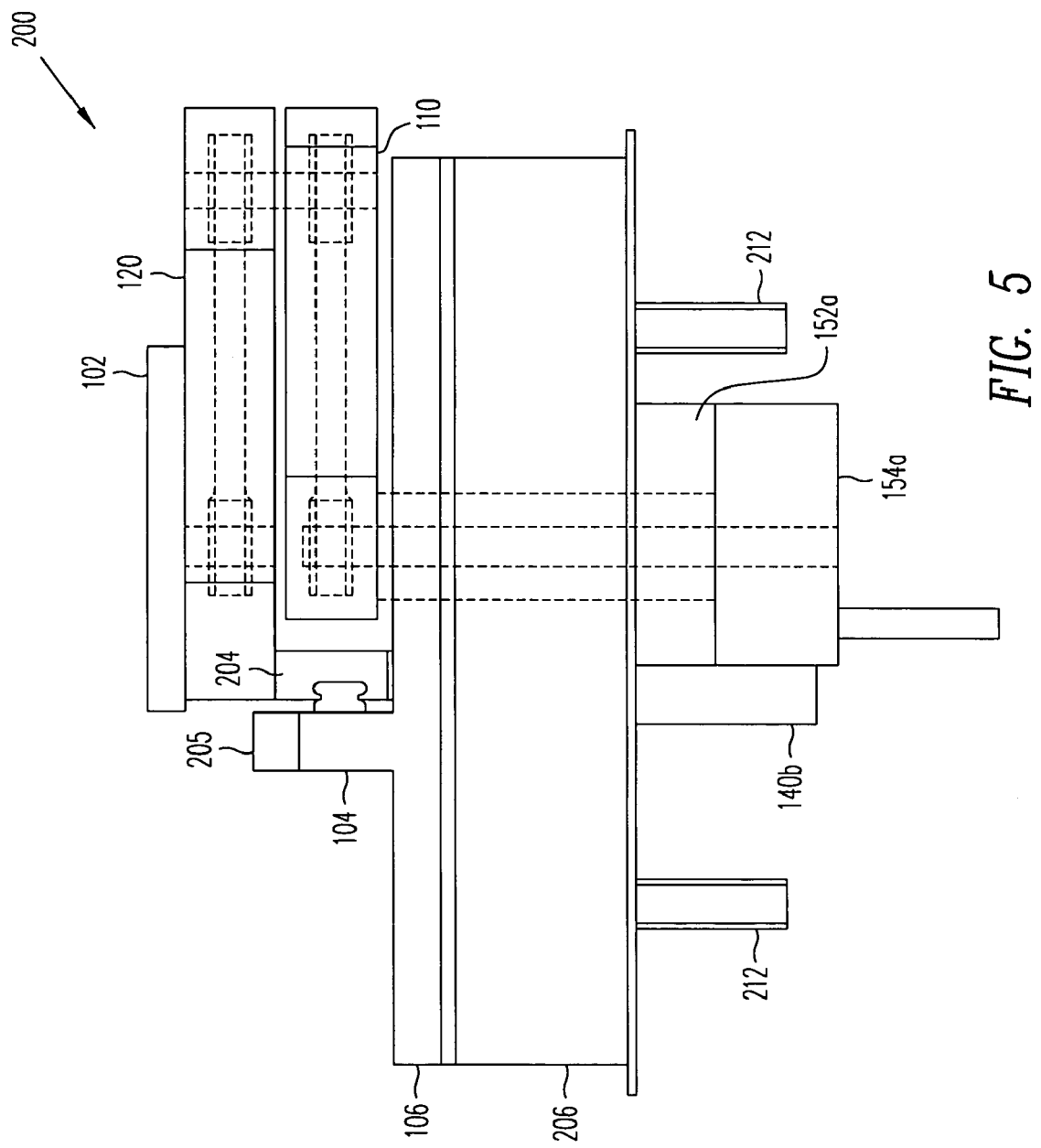

FIGS. 4 and 5 show perspective side views of a stage 200, which is similar to stage 100, like designated elements being the same. FIG. 4 shows stage 200 with the top covers of arms 110 and 120 removed. As can be seen in FIGS. 4 and 5, a block 204 that is coupled to the second arm 120 slidably engages with rail 104. FIGS. 4 and 5 also show schematically a linear encoder 205 that is coupled to stationary support 105. The linear encoder precisely monitors the location/movement of the end of second arm 120 coupled to the horizontal rail 104 and, consequently, the location of chuck 102. The linear encoder may provide location feedback to the first motor 152a that controls the linear motion of chuck 102 and may be part of a servo motion control system that provides precise horizontal linear motion of chuck 102. For example, a linear precision encoder part number M3100V manufactured by MicroE Systems, located in Natick, Mass., may be used.

Stage 200 uses motors 152a and 154a located under the base plate 106 to drive the linear and rotational motion of chuck 102. In addition, stage 200 includes a Z stage actuator 140b underneath the base plate 106, as shown in FIG. 5. Stage 200 includes vertical guide rails 212 to guide the vertical motion of stage 200. Similar to the linear encoder 205, a vertical linear encoder may be used with the motor 140b. The vertical linear encoder may be used to measure and provide feedback to the motor 140b as part of the servo motion control system that provides precise vertical linear motion of chuck 102.

While two rails are shown in FIG. 5, it should be understood that more or fewer rails may be used if desired. The rails 212 are coupled to the bottom surface of base plate 106. The motor 140b moves the base plate 106 and the entire stage 200 in a vertical direction along guide rails 112. Of course, if desired, the motor 140b may be coupled to the base plate 106 and motor 140b may move stage 200 along with itself vertically along rails 212. As can be seen in FIG.

5, the base plate 106, arms 110 and 120, and chuck 102 are all moved vertically by Z stage actuator 140b.

The vertical rails 212 may be coupled to a linear encoder that along with motor 140b is part of a servo motion control system that precisely controls the Z-motion of stage 200 and thus, chuck 102. It should be understood that in other embodiments, the stage 200 may comprise a single vertical rail or more than two rails. Alternatively, vertical rails 212 may be omitted, and motor 140b may still move stage 200 vertically using a different method (e.g. a screw device or a wedge device).

Figure 6:
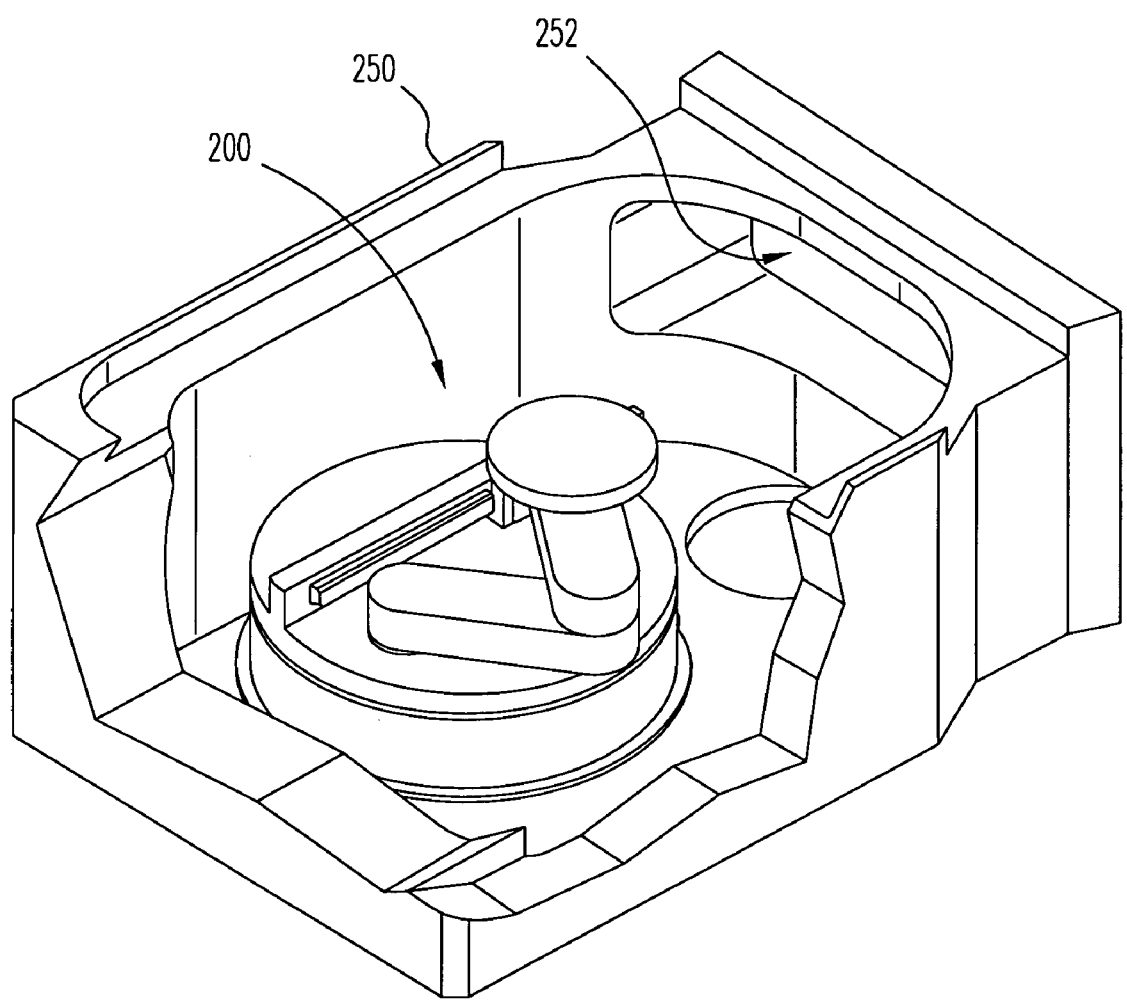
FIG. 6 shows a perspective view of the stage of FIGS. 4 and 5 in a chamber.

FIG. 6 shows stage 200 positioned in a chamber 250 (a portion of the walls of chamber 250 are cut away for clarity). The motors for stage 200 are advantageously outside the chamber 250. Substrates are loaded onto chuck 102 through the door 252 of chamber. The Z stage actuator 140b provides vertical motion to chuck that assists in loading and unloading a substrate within the chamber 250.

To maintain an appropriate seal, e.g., in a vacuum or other processing environment, steel bellows 206 may be coupled to the perimeter of base plate 106 and also be coupled to the floor of a chamber 250. Bellows 206 permit stage 200 to be in a chamber environment, while keeping motors 152a, 154a, and 140b outside of the vacuum environment. Furthermore, bellows 206 allow stage 200 approximately 1 inch of vertical motion, i.e., Z-motion. Of course, other embodiments are possible, for example, bellows 206 may be coupled to a bottom surface of base plate 106 instead of a perimeter surface of base plate 106. Bellows 206 may be constructed from materials other than welded steel and may allow stage 200 more or less than 1 inch of vertical motion.

FIGS. 7, 8, 9, and 10 are perspective, top, cut-away front and cut-away side views, respectively, of a polar coordinate stage 300, in accordance with another embodiment of the present invention. Stage 300 is similar to stage 100, like designated elements being the same. Stage 300 includes a chuck 302 that moves in a linear R direction, and rotates in the θ direction. Chuck 302 is coupled to a first arm 110 and a second arm 120 and is slidably coupled to a horizontal rail 104, which is covered by a cover 304 in FIG. 7. The chuck 302 serves as a platform that holds a substrate by the edge using stationary tabs 302a and 302b and movable tab 302c that may be biased closed. To open, the tab 302c is actuated using, e.g., a piezoelectric actuator or other appropriate actuator. For more information on an edge grip chuck, see the U.S. patent application entitled "Edge Grip Chuck", by Blaine R. Spady et al., having Ser. No. 10/198,948, filed herewith, which has the same assignee as the present disclosure, and which is incorporated herein by reference. Of course, other chucks, such as chuck 102, may be used with stage 300.

Figure 9:
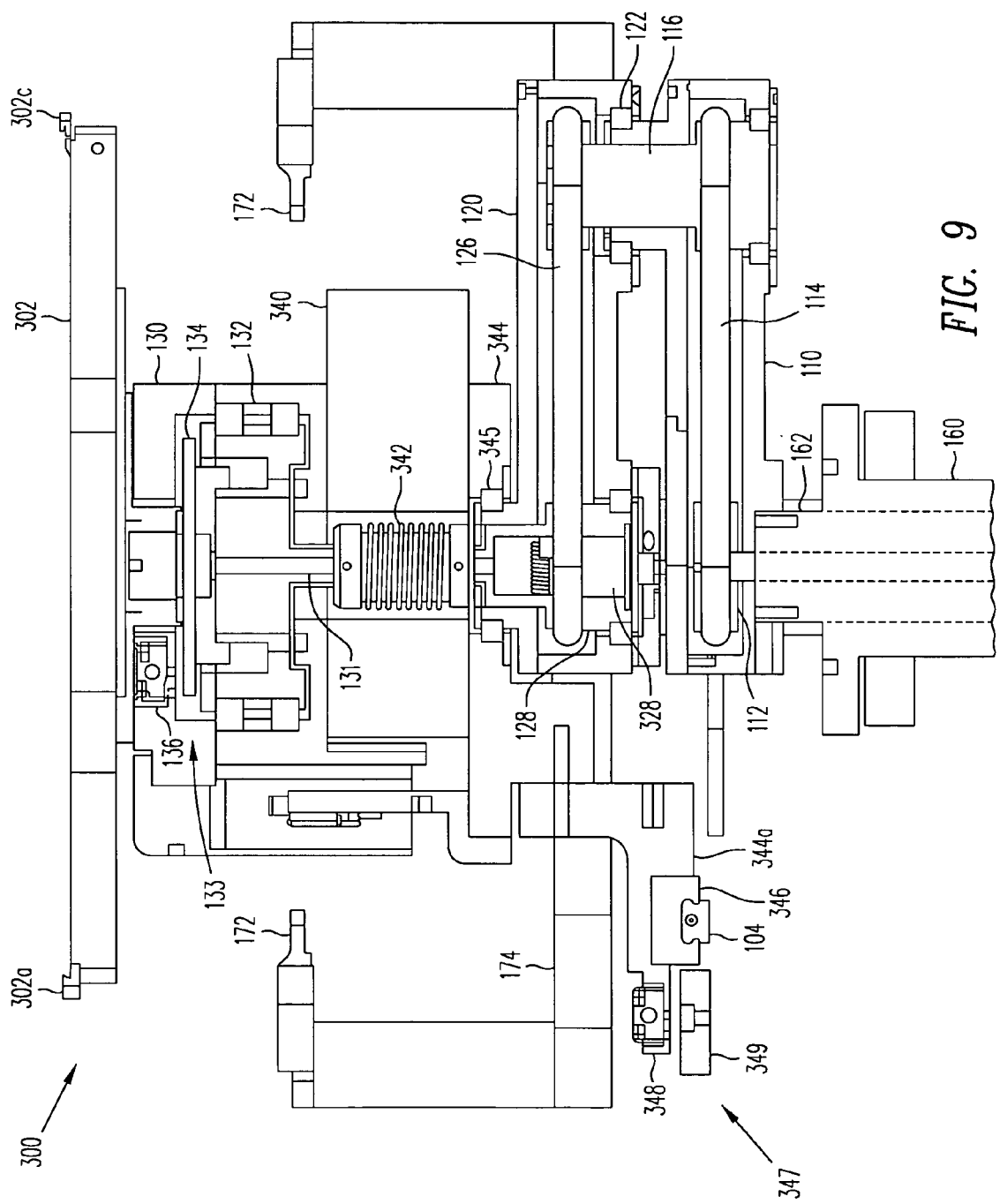

The chuck 302 is coupled to one end of the second arm 120 through a Z stage actuator 340 and a theta housing 130 that is mounted on top of the Z stage actuator 340. As can be seen in FIG. 9, a shaft 131 that is coupled to pulley 124 extends from the second arm 120 through the Z stage actuator 340 and through the theta housing 130 and is coupled to the bottom of chuck 302. Within the Z stage actuator 340, the shaft 131 includes a flexible coupling 342, so that the length of shaft 131 may be varied to accommodate the change in the vertical height of the chuck 302. The Z stage actuator 340 may be, e.g., a piezoelectric flexure type actuator or other appropriate type actuator, such as, e.g., a 1 mm Z stage manufactured by Dynamic Structures and Materials, located in Franklin, Tenn. A suitable flexible coupling 342 is manufactured by, e.g., Servometer located in Cedar Groves, N.J., as part number FC-12.

As illustrated in FIG. 9, the Z stage actuator 340 is coupled to a rotatable base 344 that is rotatably coupled to one end of the second arm 120 by bearing 345. The base 344, e.g., includes an arm 344a that is coupled to a block 346, which slidably engages the horizontal rail 104 (the cover 304 is not shown in FIG. 9). The base 344 is also coupled to a linear encoder 347 by way of arm 344a. The linear encoder 347 includes a sensor head 348 on arm 344a and a scale 349 mounted on the horizontal rail 104. To improve accuracy, the linear encoder 347 should be mounted near chuck 302 if possible. The linear encoder 347 precisely monitors the location/movement of the end of second arm 120 coupled to the horizontal rail 104 and, consequently, the location of chuck 302. The linear encoder may provide location feedback to the motor 152a that controls the linear motion of chuck 302 and may be part of a servo motion control system that provides precise horizontal linear motion of chuck 302. Likewise, a linear encoder may be used to measure and provide feedback to the position as part of the servo motion control system that provides precise vertical linear motion of chuck 102. For example, part number M3100V manufactured by MicroE Systems may be used.

Within the theta housing 130 the shaft 131 is supported by a bearing 132. In addition, the theta housing 130 includes a radial encoder 133, including a scale 134 coupled to shaft 131 and a sensor head 136. The radial encoder 133 is used to precisely monitor the location/rotation of chuck 302. The rotary encoder 133 may be electrically coupled to the motor 154a that controls the rotational motion of chuck 302 and may provide location feedback as part of a servo motion control system capable of very precise rotation of chuck 302. A rotary encoder, such as a rotary encoder part number M3100V manufactured by MicroE Systems may be used.

The rotary encoder in combination with the linear horizontal and vertical encoders allow precise movement and positioning of chuck 302. Thus, a substrate on the chuck 302 can be precisely positioned at a desired location for measurements. Controlling the motion of a stage using feedback is well known in the art.

The wires leading to the theta housing 130 for the rotary encoder, the Z stage actuator 340 controls and Z linear encoder, and the linear encoder sensor head 348 can be passed through the cover 304 and through the base plate 106. The wires leading to chuck 302 to control the opening and closing of tab 302c may likewise pass through cover 304. However, because chuck 302 rotates relative to the rest of the stage 300, a slip ring 328 is used to as a rotary contract. The slip ring 328 may be manufactured as part no. CA4-604-6 by Air Flyte Electronics, Co. in Bayonne N.J.

The linear motion of chuck 102 is controlled by way of a first arm 110 and second arm 120 that are rotatably coupled together by a bearing 122. As discussed above, the chuck 302 is coupled to one end of the second arm 120 through theta housing 130, Z stage actuator 340 and base 344. The other end of second arm 120 is coupled to an end of the first arm 110 and the other end of the first arm 110 is coupled to a motor 152a through the base plate 106 by way of a coaxial feedthrough 160. For example, the outer shaft 162 of the coaxial feedthrough 160 may be used to couple the rotary motor 352 to the first arm 110. The rotation of the first arm 110 is translated through the second arm 120 to linear motion for the chuck 302 along horizontal rail 104 in the R direction.

Figure 10:
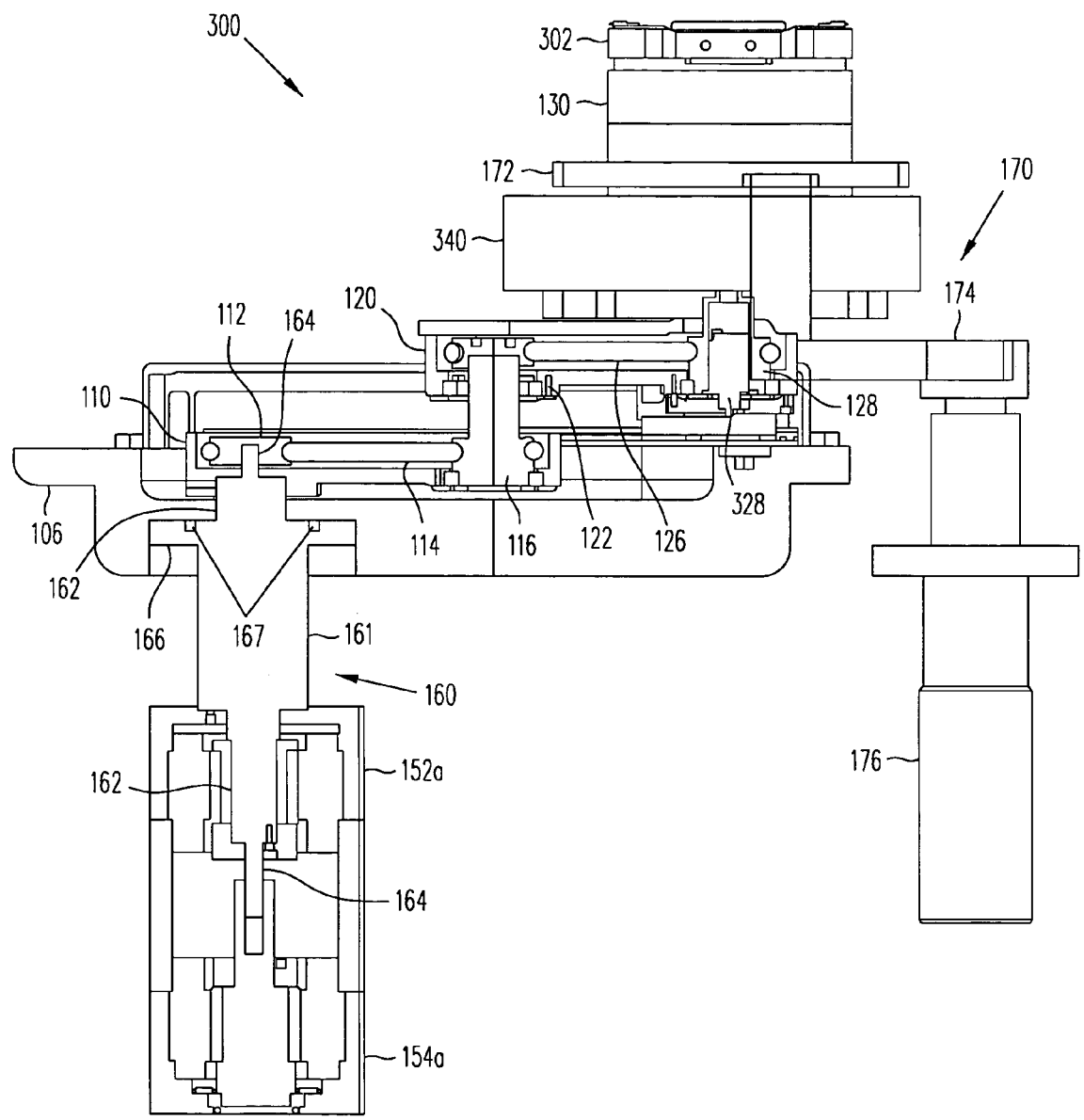

As shown in FIG. 10, the coaxial feedthrough 160 includes a body 161, an outer shaft 162 and an inner shaft 164. Coaxial feedthrough 160 has a flange 166 (with a gasket groove 167), which may be used to couple the feedthrough to the bottom of the base plate 106. Flange 166 may also have holes to accommodate bolts or screws for coupling to the base plate 106. Alternatively, coaxial feedthrough 160 may have a threaded portion to attach the device to the base plate 106. Coaxial feedthrough 160 may be, e.g., part no. 10c-21120500 purchased from Rigaku Inc., located in Woodlands, Tex., or any other desired coaxial feedthrough may be used.

As discussed above, chuck 302 is also capable of rotational movement, i.e., in the θ direction, as shown in FIG. 7. To produce the rotational movement of the chuck 302, the stage 300 uses a belt and pulley system as described in FIGS. 1 and 2. The motor 154a is coupled to the belt and pulley system, e.g., by way of an inner shaft 164 of the coaxial feedthrough 160, shown in FIG. 10.

The belt and pulley system may be sealed within arms 110 and 120, as shown in FIG. 7, to reduce particle contamination. In other embodiments, the belt and pulley system may be exposed. If the system is intended to operate in a vacuum, all belts and pulleys should be vacuum compatible.

It should be understood that because the chuck 302 rotates, the chuck 102 requires only a small amount of linear motion to measure or inspect any point on the substrate. In other words, the chuck 102 need only travel in the R direction by an amount approximately equal to the radius of the largest substrate to be measured.

Similar to stage 200, stage 300 may be positioned within a chamber 350 as shown in perspective view in FIG. 11 (the sidewalls and ceiling of chamber 350 are missing in FIG. 11 for clarity). A substrate is loaded onto stage 300 through door 352 of chamber 350. Because stage 300 includes the Z stage actuator 340 between the second arm 120 and the chuck 302, there is no need to mount the stage 300 to the chamber 350 using bellows, as used with stage 200. Consequently, the base plate 106 may be mounted directly to the floor of the chamber 350, or as shown in FIG. 11, base plate 106 serves as the floor of the chamber 350. The compact design of stage 300 and the external placement of the motors advantageously permit stage 300 to be located within a chamber.

Stage 300 includes a substrate lift 170 that includes fingers 172 on arms 174 and that is used to assist in loading and unloading a substrate onto stage 300. The arms 174 are coupled to a Z actuator 176 that raises and lowers the arms 174 and fingers 172, e.g., by up to two inches. When loading a substrate, chuck 302 is moved away from the substrate lift 170 to provide clearance. The substrate is placed on the fingers 172 of the substrate lift 170, e.g., through door 352 of the chamber 350. The substrate lift 170 then raises the substrate and chuck 302 moves under the substrate. The substrate lift 170 is then lowered to place the substrate on the chuck 302. The substrate is then processed, e.g., measured, with the substrate lift 170 in the lowered position. To unload a substrate, the process is reversed, with the arms 174 and fingers 172 are raised to unload the substrate from the chuck 302, the chuck 302 is moved away, the substrate lift 170 is lowered and the substrate is removed from the substrate lift 170, e.g., through door 352 of chamber 350.

In addition, as shown in FIGS. 7 and 11, a stage in accordance with the present may include a prealigner 360. The prealigner 360 includes an illumination source 362, e.g., a laser, laser diode or light emitting diode, and a detector 364 that is coupled to a processor 366. The detector 364 is located in the ceiling of the chamber in which the stage located (the ceiling is not shown in FIGS. 7 and 11) while the source 362 is located in the base plate 106. Of course if desired, the positions of the radiation source 362 and detector 364 may be reversed. In use, after the substrate is loaded onto the chuck 302, the chuck 302 rotates the substrate. The prealigner 360 detects the edge and a notch or flat along the edge of the substrate as the substrate rotates and is thus able to calculate the position of the substrate. One type of prealigner that may be used is described in more detail in U.S. patent application entitled "High Precision Substrate Prealigner", by Blaine R. Spady et al., having Ser. No. 10/199,278, filed herewith, which has the same assignee as the present disclosure, and which is incorporated herein by reference.

FIGS. 12 and 13 show a perspective view and a top view of a stage 400 in a chamber 450. Stage 400 is similar to stage 300, like designated elements being the same. Stage 400, however, includes a motor 402 that is coupled to the chuck 302 through a leadscrew 404 that is supported by bearing 405 opposite motor 402. Motor 402 is located to the side of stage 400 as opposed to underneath the stage 400. The leadscrew 404 engages a lead nut in housing 406. The linear motion of chuck 302 is driven by motor 402 rotating the leadscrew 404. The chuck 302, along with theta housing 130 and the Z stage actuator 340, are supported by arms 110 and 120. The rotational motion of chuck 302 may still be driven by motor 154a under the base plate 106 as described above.

FIGS. 14 and 15 show a perspective view and a top view of a stage 500 in a chamber 550. Stage 500 is similar to stage 400, like designated elements being the same. Stage 500, however, includes an additional side mounted motor 502 that is coupled to the chuck 302 through a leadscrew 504 that is supported by bearing 505 opposite motor 502. Motor 502 drives the rotational motion of chuck 302, while motor 402 drives the linear motion of chuck 302. Leadscrew 504 is coupled to a gear housing 506 that includes, e.g., a 90 gear or worm gear and a clutch. The 90 degree gear or worm gear in housing 506 converts the rotation of leadscrew 505 into rotation of chuck 302. The clutch in housing 506 is used to disengage the 90 degree gear from the leadscrew 505 when chuck 302 is moved linearly by motor 402. Once the linear movement of the chuck 302 is stopped, the clutch engages the 90 degree gear with the leadscrew 505 so that rotation of the leadscrew 505 rotates the chuck 302. The use of a clutch and 90 degree gear or worm gear is well understood by those skilled in the art.

Arms 110 and 120 are obviated in stage 500 as the drive for the linear motion and rotational motion of chuck 302 is provided from the side via lead motors 402 and 502 and leadscrews 404 and 504. Stage 500 may include support rails 508 and 510 to support chuck 302 along with theta housing 130, Z actuator stage 340, and housings 406 and 506. Of course, if desired, arms 110 and 120 may be used instead of support rails 508 and 510 may be.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, various combinations of components may be used in accordance with the present invention. Thus, the spirit and scope of the appended claims should not be limited to the foregoing description.

What is claimed is:

1. An apparatus comprising:
   a stage for handling a substrate, said stage comprising:
   a first arm having a first end and a second end;

a second arm having a first end and a second end, said first end of said second arm being rotatably coupled to said second end of said first arm;

a chuck rotatably coupled to said second end of said second arm;

a horizontal rail slidably coupled to said chuck, wherein said chuck moves along said horizontal rail;

a first motor coupled to said chuck, said first motor providing rotational movement of the first arm about the first end, rotational movement of the second arm about the first end relative to the second end of the first arm, and rotational movement of the second arm about the second end to drive the horizontal linear motion of said chuck along said horizontal rail; and a second motor coupled to said chuck, said second motor driving the rotation of said chuck.

2. The stage of claim 1, wherein said first motor is coupled to the first end of said first arm, said first motor rotates said first arm at said first end to drive the horizontal linear motion of said chuck.

3. The apparatus of claim 1, further comprising a base plate, wherein said first arm, said second arm, said chuck and said horizontal rail are positioned on a first side of said base plate and said first motor and said second motor are positioned on a second side of said base plate.

4. The apparatus of claim 3, further comprising a coaxial feedthrough through said base plate, said coaxial feedthrough comprising a first shaft and a second shaft, said first shaft coupling said first motor to said first end of said first arm, said second shaft being coupled to said second motor.

5. The apparatus of claim 3, further comprising a third motor coupled to said second side of said base plate, said third motor being operable to move said base plate vertically.

6. The apparatus of claim 5, further comprising at least one vertical rail coupled to said base plate, said third motor being operable to move said base plate vertically along said vertical rail.

7. The apparatus of claim 5, further comprising bellows coupled to a perimeter of said base plate.

8. The apparatus of claim 1, wherein said chuck is coupled to said second motor with a belt and pulley system comprising:

a first pulley at said first end of said first arm, said first pulley is coupled to said second motor;

a second pulley at said second end of said first arm and said first end of said second arm;

a first belt coupled between said first pulley and said second pulley;

a third pulley at said second end of said second arm;

a second belt coupled between said second pulley and said third pulley; and said chuck being coupled to said third pulley.

9. The apparatus of claim 1, further comprising a vertical actuator coupled between said second arm and said chuck to produce vertical motion of said chuck.

10. The apparatus of claim 1, further comprising a chamber, wherein said first arm, said second arm, said horizontal rail, and said chuck are within said chamber, and said first motor, said second motor are outside said chamber.

11. The apparatus of claim 10, further comprising a prealigner mounted in said chamber.

12. The apparatus of claim 1, wherein a linear encoder is coupled to said horizontal rail and coupled to said chuck to monitor the horizontal linear motion of said chuck.

13. The apparatus of claim 12, wherein said linear encoder is mounted on said horizontal rail and between said second arm and said chuck.

14. The apparatus of claim 1, wherein a rotary encoder is coupled to said chuck to monitor the rotation of said chuck.

15. The stage of claim 1, wherein said first motor is coupled to and moves the second end of said second arm.

16. The stage of claim 15, further comprising a leadscrew coupled to said first motor and engaged with a lead nut coupled to said second end of said second arm, said first motor driving the horizontal linear motion of said chuck by rotating said leadscrew.

17. The apparatus of claim 1, wherein said chuck is coupled to said second motor at the second end of said second arm, said stage further comprising a leadscrew coupled to said second motor and engaged with at least one of a 90 degree gear and a worm gear to translate rotational motion of said leadscrew into rotation of said chuck.

18. The stage of claim 17, further comprising a clutch to engage and disengage said at least one of a 90 degree gear and worm gear with said leadscrew.

19. An apparatus comprising:

a rotatable arm that is rotatable about a first end;

a second arm having a first end coupled to a second end of said rotatable arm;

a chuck coupled to a second end of said second arm;

a horizontal rail coupled to said chuck; and a first motor coupled to said chuck; said first motor drives the linear rotation of said chuck;

a second motor coupled to said chuck, said second motor drives the rotational motion of said chuck; and a chamber, wherein said rotatable arm said second arm: said chuck, and said horizontal rail are located inside of said chamber and wherein said first motor and said second motor are located outside said chamber.

20. The apparatus of claim 19, further comprising:

a first rotatable pulley in said first end of said rotatable arm;

a second rotatable pulley in said second end of said rotatable arm and said first end of said second arm, said second rotatable pulley is coupled to said first rotatable pulley; and a third rotatable pulley in said second end of said second arm, said third rotatable pulley is coupled to said second rotatable pulley and said chuck, wherein the rotation of said first rotatable pulley is translated through said second rotatable pulley and said third rotatable pulley to rotate said chuck.

21. The apparatus of claim 20, wherein said first rotatable pulley and said second rotatable pulley are coupled together by a first belt and said second rotatable pulley and said third rotatable pulley are coupled together by a second belt.

22. The apparatus of claim 20, further comprising:

a second motor coupled to said first rotatable pulley, said second motor rotates said first rotatable pulley.

23. The apparatus of claim 19, further comprising:

a third motor coupled to said rotatable arm, said second arm; said chuck, and said horizontal rail, said third motor moves said rotatable arm, said second arm; said chuck, and said horizontal rail vertically, said third motor being located outside said chamber.

24. The apparatus of claim 19, further comprising a prealigner mounted in said chamber.

25. The apparatus of claim 19, further comprising:

an actuator coupled between said second end of said second arm and said chuck, said actuator moves said chuck vertically.

26. The apparatus of claim 19, further comprising:
a motor coupled to said rotatable arm, said motor rotates said first arm, wherein when said rotatable arm rotates about said first end, said rotation is translated through said second arm to move said chuck linearly along said horizontal rail.

27. The apparatus of claim 19, further comprising a motor coupled to said chuck at said second end of said second arm, said motor driving the horizontal linear motion of said chuck.

28. The apparatus of claim 27, further comprising a leadscrew coupled to said motor and engaged with a lead nut coupled to said second end of said second arm, said motor driving the horizontal linear motion of said chuck by rotating said leadscrew.

29. The apparatus of claim 19, further comprising a motor coupled to said chuck at said second end of said second arm, said stage further comprising a leadscrew coupled to said second motor and engaged with at least one of a 90 degree gear and a worm gear to translate rotational motion of said leadscrew into rotation of said chuck.

30. The apparatus of claim 29, further comprising a clutch to engage and disengage said at least one of a 90 degree gear and worm gear with said leadscrew.

31. An apparatus comprising:
a chamber;
a polar coordinate stage within said chamber, said polar coordinate stage having a chuck that moves in a horizontal linear direction and that rotates, wherein said polar coordinate stage further comprises:
a first arm that is rotatable about a first end;
a second arm having a first end coupled to a second end of said first arm;
said chuck is coupled to a second end of said second arm; and
a horizontal rail slidably coupled to said chuck;
a first motor mounted outside said chamber, said first motor coupled to said chuck and drives the horizontal linear motion of said chuck; and
a second motor mounted outside said chamber said second motor coupled to said chuck and drives the rotational motion of said chuck.

32. The apparatus of claim 31, wherein said first motor is coupled said first end of said first arm and drives the rotation of said first arm, wherein rotation of said first arm is translated into the horizontal linear motion of said chuck along said horizontal rail.

33. The apparatus of claim 31, wherein said first motor is coupled to said second end of said second arm, said first motor driving the horizontal linear motion of said chuck.

34. The apparatus of claim 33, further comprising a leadscrew coupled to said first motor and engaged with a lead nut coupled to said second end of said second arm, said first motor driving the horizontal linear motion of said chuck by rotating said leadscrew.

35. The apparatus of claim 31, further comprising:
a first rotatable pulley in said first end of said first arm;
a second rotatable pulley in said second end of said first arm and said first end of said second arm, said second rotatable pulley is coupled to said first rotatable pulley; and
a third rotatable pulley in said second end of said second arm, said third rotatable pulley is coupled to said second rotatable pulley and said chuck;
wherein said second motor is coupled to a first rotatable pulley and the rotation of said first rotatable pulley is translated through said second rotatable pulley and said third rotatable pulley to rotate said chuck.

36. The apparatus of claim 35, wherein said first rotatable pulley and said second rotatable pulley are coupled together by a first belt and said second rotatable pulley and said third rotatable pulley are coupled together by a second belt.

37. The apparatus of claim 31, wherein said second motor is coupled to said second end of said second arm, said second motor driving the rotational motion of said chuck, said apparatus further comprising:
a leadscrew coupled to said second motor; and
at least one of a 90 degree gear and a worm gear coupled to said second end of said second arm and removably engaged with said leadscrew;
wherein rotation of said leadscrew is translated to rotational motion of said chuck by said at least one of a 90 degree gear and a worm gear.

38. The apparatus of claim 37, further comprising a clutch to engage and disengage said at least one of a 90 degree gear and worm gear with said leadscrew.

39. The apparatus of claim 31, further comprising an actuator coupled to said chuck for driving a vertical linear motion of said chuck.

40. The apparatus of claim 39, wherein said actuator is mounted outside said chamber.

41. The apparatus of claim 31, further comprising an actuator disposed between said chuck and said second end of said second arm, said actuator for moving said chuck in a vertical linear direction.

42. The apparatus of claim 31, further comprising a substrate lift located within said chamber, said substrate lift comprising:
a plurality of fingers for holding a substrate to be loaded onto said chuck; and
an actuator coupled to said plurality of fingers, said actuator moving said plurality of fingers in a vertical linear direction.

43. The apparatus of claim 31, further comprising a prealigner mounted in said chamber.

* * * * *